(12) United States Patent
Kim

(10) Patent No.: US 7,427,799 B2
(45) Date of Patent: Sep. 23, 2008

(54) COMPLEMENTARY METAL OXIDE SEMICONDUCTOR IMAGE SENSOR AND METHOD FOR FABRICATING THE SAME

(75) Inventor: Shang Won Kim, Choongcheongbukdo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 86 days.

(21) Appl. No.: 11/641,831

(22) Filed: Dec. 20, 2006

(65) Prior Publication Data

US 2007/0120163 A1 May 31, 2007

Related U.S. Application Data

(62) Division of application No. 11/022,647, filed on Dec. 28, 2004, now Pat. No. 7,166,489.

(30) Foreign Application Priority Data

Aug. 11, 2004 (KR) .............................. P 2004-63033

(51) Int. Cl.

| | |
|---|---|
| H01L 31/00 | (2006.01) |
| H01L 27/108 | (2006.01) |
| H01L 29/04 | (2006.01) |
| H01L 29/12 | (2006.01) |
| H01L 29/76 | (2006.01) |
| H01L 31/036 | (2006.01) |
| H01L 31/112 | (2006.01) |
| H01L 29/18 | (2006.01) |
| H01L 33/00 | (2006.01) |
| H01L 29/20 | (2006.01) |
| H01L 29/205 | (2006.01) |
| H01L 29/22 | (2006.01) |

(52) U.S. Cl. .................... 257/440; 257/69; 257/88; 257/89; 257/91; 257/98; 257/431; 257/432; 257/434; 257/435; 257/436

(58) Field of Classification Search .................. 257/69, 257/88–89, 91, 98, 431–432, 434–436, 440
See application file for complete search history.

(56) References Cited

U.S. PATENT DOCUMENTS 5,595,930 A    1/1997   Baek (Continued)

FOREIGN PATENT DOCUMENTS

JP       2001-309395       2/2001

(Continued)

OTHER PUBLICATIONS

Office Action from the Korean Intellectual Property Office, dated Jun. 19, 2006, in counterpart Korean Patent Application No. 10-2004-0063033.

(Continued)

*Primary Examiner*—Ida M Soward
(74) *Attorney, Agent, or Firm*—Finnegan, Henderson, Farabow, Garrett, & Dunner, L.L.P.

(57) ABSTRACT

A CMOS image sensor and a method for fabricating the same is disclosed, to enhance the image-sensing efficiency by forming a concave lens area for improving the light-condensing efficiency in a planarization layer formed before a microlens array, in which the CMOS image sensor includes a plurality of photosensitive devices on a semiconductor substrate; an insulating interlayer on the plurality of photosensitive devices; a plurality of color filter layers in correspondence with the respective photosensitive devices, to filter the light by respective wavelengths; a planarization layer on the color filter layers, and having first micro-lens by intaglio in correspondence with the respective photosensitive patterns to condense the light secondly; and a plurality of second micro-lens layers on the planarization layer in correspondence with the respective photosensitive devices, to condense the light firstly.

3 Claims, 5 Drawing Sheets

U.S. PATENT DOCUMENTS

| | | |
|---|---|---|
| 6,753,557 B2 * | 6/2004 | Nakai .......................... 257/233 |
| 6,803,250 B1 | 10/2004 | Yaung et al. |
| 6,821,810 B1 | 11/2004 | Hsiao et al. |
| 2003/0063204 A1 * | 4/2003 | Suda .......................... 348/272 |
| 2003/0168679 A1 | 9/2003 | Nakai et al. |
| 2004/0142501 A1 | 7/2004 | Nakai et al. |
| 2005/0061950 A1 * | 3/2005 | Jiang et al. ................ 250/208.1 |
| 2005/0205898 A1 * | 9/2005 | Van Arendonk et al. ...... 257/222 |
| 2005/0242271 A1 * | 11/2005 | Weng et al. ............... 250/214.1 |
| 2005/0274968 A1 | 12/2005 | Kuo et al. |
| 2007/0029469 A1 * | 2/2007 | Rhodes ................... 250/214 R |

FOREIGN PATENT DOCUMENTS

| | | |
|---|---|---|
| JP | 2003-315506 | 6/2003 |
| KR | 10-2001-0037841 A | 5/2001 |
| KR | 10-2002-0042098 A | 5/2002 |

OTHER PUBLICATIONS

Office Action from the Japanese Intellectual Property Office, dated Jun. 19, 2006, in counterpart Japanese Patent Application No. 2004-376950.

* cited by examiner

COMPLEMENTARY METAL OXIDE SEMICONDUCTOR IMAGE SENSOR AND METHOD FOR FABRICATING THE SAME

CROSS-REFERENCE TO RELATED APPLICATIONS

This application claims the benefit of priority of Korean Application No. P2004-63033, filed on Aug. 11, 2004, and this application is a divisional of application Ser. No. 11/022,647, filed Dec. 28, 2004 now U.S. Pat. No. 7,166,489. The entire contents of these applications are hereby incorporated by reference in their entirety.

BACKGROUND OF THE INVENTION

1. Field of the Invention

The present invention relates to an image sensor, and more particularly, to a CMOS (complementary metal oxide semiconductor) image sensor and a method for fabricating the same, to enhance the image-sensing efficiency by forming a concave lens area for improving the light-condensing efficiency in a planarization layer formed before a micro-lens array.

2. Discussion of the Related Art

Generally, an image sensor is a semiconductor device for converting an optical image into an electric signal. The image sensor can be broadly categorized into a charge coupled device (CCD) and a complementary metal oxide semiconductor (CMOS) image sensor.

The CMOS image sensor is provided with a photodiode PD for sensing the light, and a CMOS logic circuit for converting the sensed light to data of electric signals. At this time, as the amount of sensed light increases, photosensitivity of the image sensor improves.

In order to improve the photosensitivity, there is requirement for enhancing a fill factor of occupying a photodiode area in an entire area of the image sensor, or for condensing the light to the photodiode by changing the light-path of the light incident on the remaining areas except the photodiode area.

For example, a micro-lens may be provided to condense the light. That is, a convex micro-lens is provided above the photodiode, wherein the convex micro-lens is formed of a material having great transmittance. As a result, the incident light is refracted by the convex micro-lens, whereby it is possible to provide more light to the photodiode. In this case, the light parallel to an optical axis of the micro-lens is refracted by the micro-lens, so that a focus is formed at a predetermined point of the optical axis.

Hereinafter, a related art CMOS image sensor and a method for forming a micro-lens therein will be described with reference to the accompanying drawings.

FIG. 1 is a schematic view of a related art micro-lens of a CMOS image sensor.

As shown in FIG. 1, a related art CMOS image sensor includes photodiode areas 11, an insulating interlayer 12, a protective layer 13, an R/G/B color filter layer 14, a planarization layer 15, and a convex micro-lens 16. At this time, at least one photodiode area 11 is formed on a semiconductor substrate (not shown) to generate electric charges dependent on the amount of incident light. Also, the insulating interlayer 12 is formed on an entire surface of the semiconductor substrate (not shown) including the photodiode areas 11, and the protective layer 13 is formed on the insulating interlayer 12. Then, the R/G/B color filter layer 14 is formed on the protective layer 13 so as to transmit the light by respective wavelengths, and the planarization layer 15 is formed on the color filter layer 14. The convex micro-lens 16 having a predetermined curvature is provided on the planarization layer 15, so as to condense the light passing through the color filter layer 14 to the photodiode areas 11.

Although not shown, an optical shielding layer is provided in the insulating interlayer 12, wherein the optical shielding layer prevents the light from being incident to the remaining areas except the photodiode areas 11.

At this time, it is possible to provide a photogate instead of the photodiode.

Herein, the curvature and the height ('A' of FIG. 1) of the convex micro-lens 16 are determined in due consideration of the focus of the condensed light. Also, the micro-lens 16 is generally formed of polymer resin, which is formed in a sequential process of deposition, patterning, and reflow. That is, the optimal size, curvature and thickness of the micro-lens 16 are determined in due consideration of position and shape of a unit pixel region, thickness of a photosensitive device, and height, position and size of the optical shielding layer.

On fabrication of the related art CMOS image sensor, the micro-lens 16 is a very important component for enhancing the light-condensing efficiency. The micro-lens 16 is provided to condense more light to the photodiode area 11 through the color filter layer 14 when the ambient light is irradiated.

The light incident on the image sensor is condensed by the micro-lens 16, and then is filtered through the color filter layer. After that, the filtered light is incident on the photodiode area 11 provided below the color filter 14. At this time, the optical shielding layer prevents the incident light from getting out of the path.

However, the micro-lens of the related art CMOS image sensor has the following disadvantages.

The light parallel to the optical axis of the micro-lens is refracted and transmitted to the photosensitive device being opposite to the micro-lens, thereby operating the device. However, the light being not parallel to the optical axis of the micro-lens is refracted and transmitted to the photosensitive device not to receive the light, whereby the device has misoperation.

Also, the amount of light transmitted to the photosensitive device is varied on the kind and thickness of the lower layer positioned below the micro-lens, whereby the light-condensing efficiency lowers, thereby deteriorating the picture quality.

SUMMARY OF THE INVENTION

Accordingly, the present invention is directed to a CMOS image sensor and a method for fabricating the same that substantially obviate one or more problems due to limitations and disadvantages of the related art.

An object of the present invention is to provide a CMOS image sensor and a method for fabricating the same, to enhance the image-sensing efficiency by forming a concave lens area for improving the light-condensing efficiency in a planarization layer formed before a micro-lens array.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a plurality of photosensitive devices on a semiconductor substrate; an insulating interlayer on the plurality of photosensitive devices; a plurality of color filter layers in correspondence with the respective photosensitive devices, to filter the light by respective wavelengths; a planarization layer on the color filter layers, and having first micro-lens by intaglio in correspondence with the respective photosensitive patterns to condense the light secondly; and a plurality of second micro-lens layers on the planarization layer in correspondence with the respective photosensitive devices, to condense the light firstly.

In another aspect, a method for fabricating a CMOS image sensor includes steps of forming an insulating interlayer on a semiconductor substrate having a plurality of photosensitive devices; forming a protective layer on the insulating interlayer; forming color filter layers in correspondence with the respective photosensitive devices; forming a plurality of first micro-lens provided densely to each of the photosensitive devices by forming a planarization layer on the color filter layers, and selectively patterning the planarization layer; and forming a plurality of second micro-lens layers by depositing a material layer on the first micro-lens, and performing patterning and reflowing process thereon.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for fabricating the same according to the present invention will be described with reference to the accompanying drawings.

Figure 1:
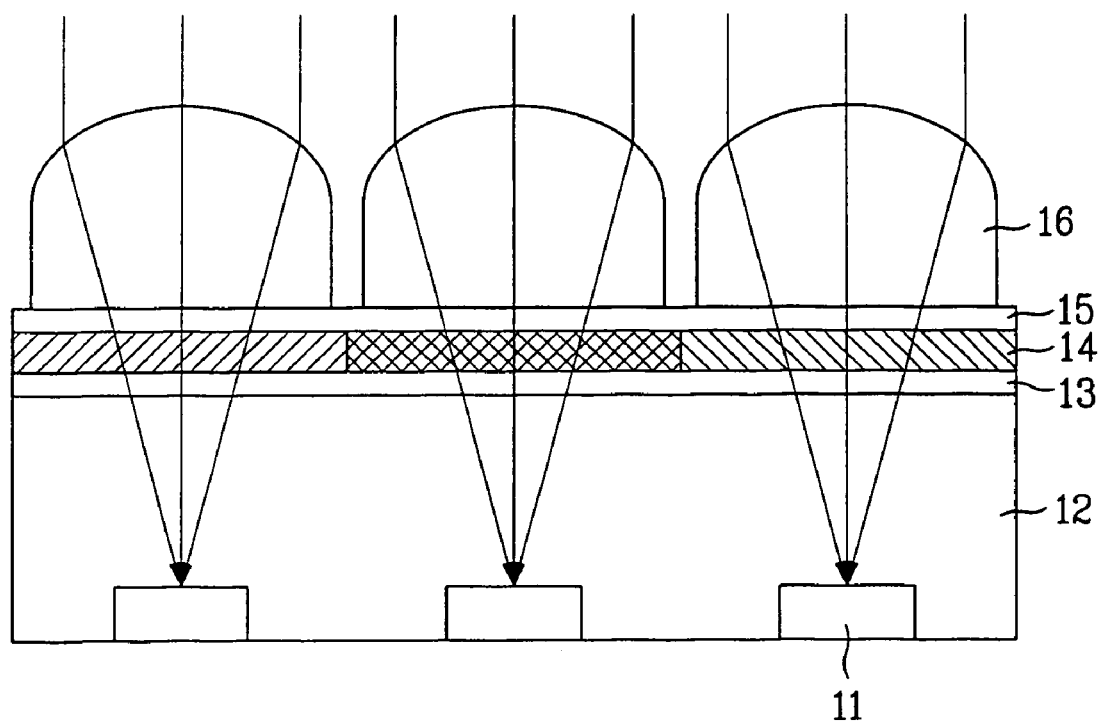
FIG. 1 shows a micro-lens of a related art COS image sensor.
Figure 2A:
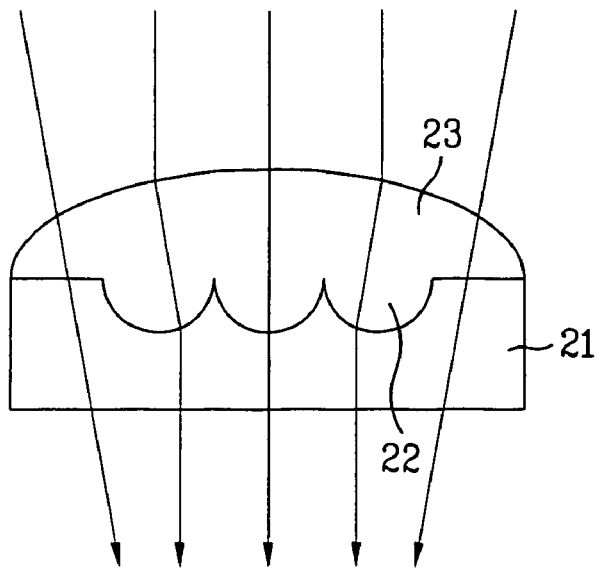
FIG. 2A shows a cross sectional view of a concave lens area according to the present invention.
Figure 2B:
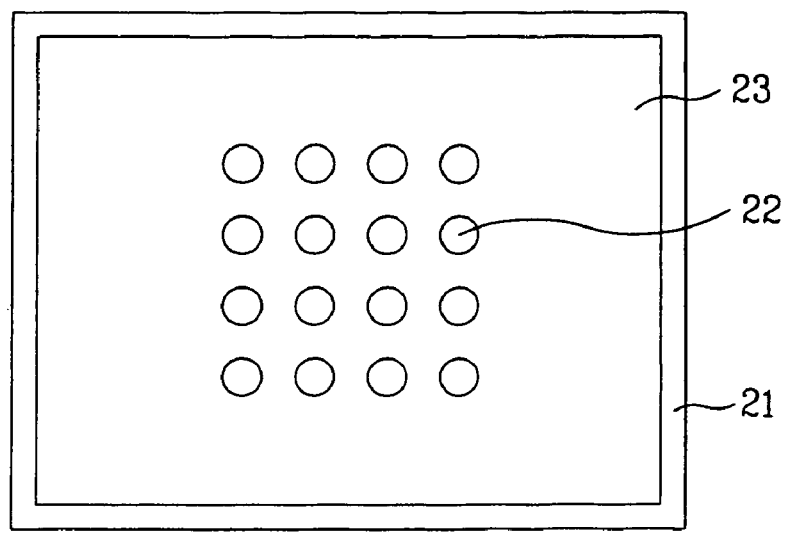
FIG. 2B shows a plane view of a concave lens area according to the present invention.

FIG. 2A shows a cross sectional view of a concave lens area according to the present invention. FIG. 2B shows a plane view of a concave lens area according to the present invention.

Generally, before forming a micro-lens in a surface of a CMOS image sensor, a color filter array is formed, and a planarization process is performed thereon. However, in the present invention, on performing the planarization process, a planarization layer is provided to have a concave pattern corresponding to a micro-lens, so that it is possible to improve the light-condensing efficiency and the uniformity in the micro-lens.

That is, a mask process is performed to remove the planarization layer except a portion of a cell of the color filter array CFA. In order to perform the mask process, a mask layer has an open area of 0.3 µm to 0.4 µm, as shown in FIG. 2A and FIG. 2B, whereby the planarization layer has the concave pattern corresponding to the micro-lens.

Accordingly, the planarization layer 21 has the concave pattern in intaglio, whereby a first micro-lens 22 of the concave pattern is formed in the planarization layer 21, for improving the light-condensing efficiency and the uniformity.

The first micro-lens 22 may be formed in an isotropic etching process, and the concave pattern of the first micro-lens 22 is filled with a material for a second micro-lens 23.

The light is firstly refracted and condensed by the second micro-lens 23, and then the condensed light by the second micro-lens 23 is secondly refracted by the first micro-lens 22, and is transmitted to photosensitive devices provided below the first micro-lens 22.

A method for fabricating the CMOS image sensor according to the present invention will be described as follows.

Figure 3:
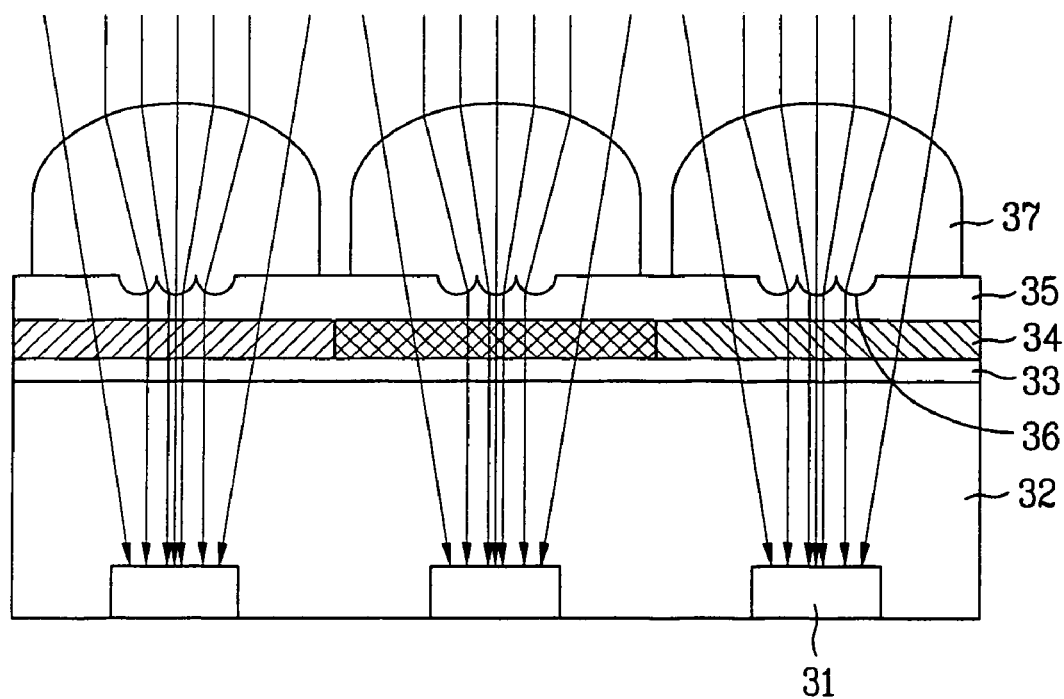
FIG. 3 shows a cross sectional view of a CMOS image sensor according to the present invention.
Figure 4A:
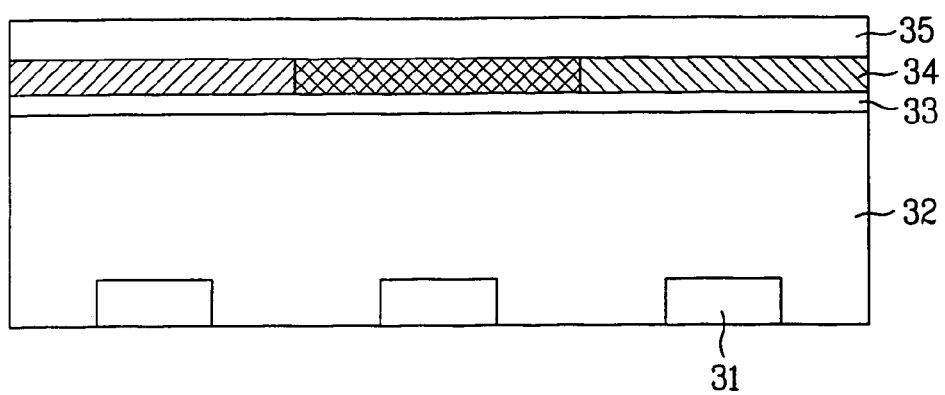
FIG. 4A to FIG. 4C show cross sectional views of the fabrication process for a CMOS image sensor according to the present invention.
Figure 4B:
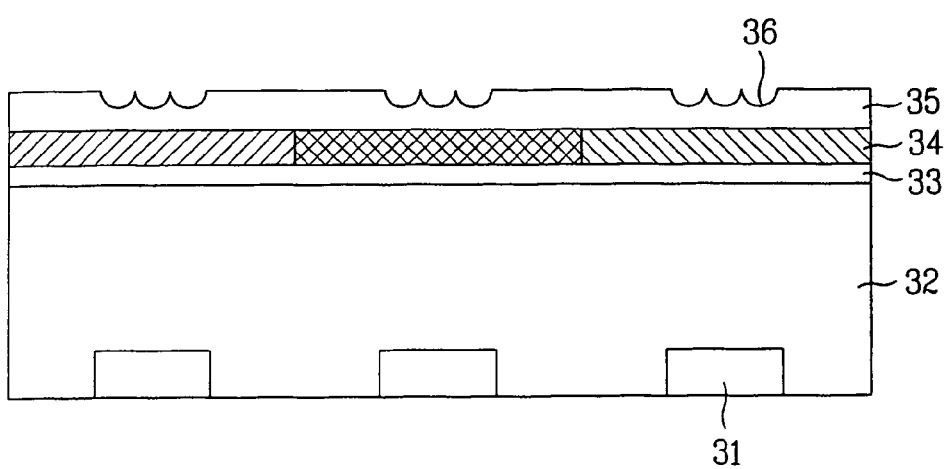
Figure 4C:
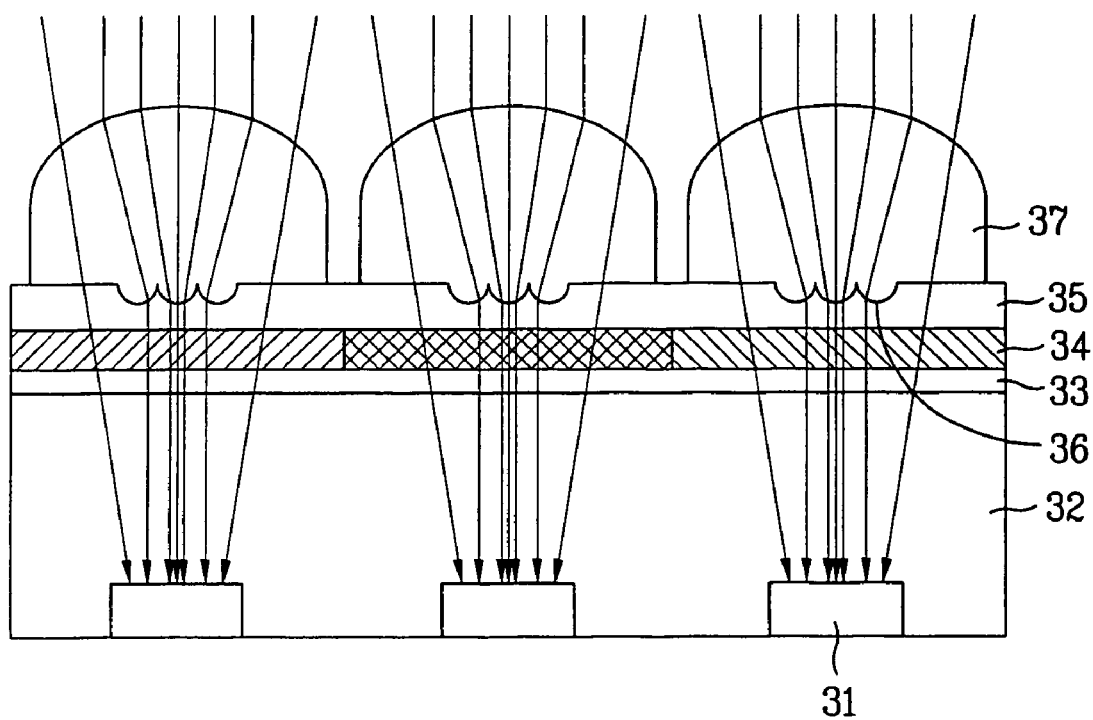

FIG. 3 shows a cross sectional view of the CMOS image sensor according to the present invention. FIG. 4A to FIG. 4C show cross sectional views of the fabrication process for the CMOS image sensor according to the present invention.

As shown in FIG. 3, the CMOS image sensor according to the present invention includes at least one photodiode 31, an insulating interlayer 32, a protective layer 33, R/G/B color filter layers 34, a planarization layer 35, a main micro-lens 37. At this time, at least one photodiode 31 is formed on a semiconductor substrate (not shown) so as to generate electric charges dependent on the amount of incident light. Also, the insulating interlayer 32 is formed on an entire surface of the semiconductor substrate (not shown) including the photodiode 31. Then, the protective layer 33 is formed on the insulating interlayer 32, and the R/G/B color filter layers 34 are formed on the protective layer 33 to transmit the light by respective wavelengths. The planarization layer 35 has a first micro-lens 36 of a concave pattern to secondly condense the light firstly condensed by the main micro-lens 37 provided above the color filter layers 34, and the main micro-lens 37 of a predetermined curvature is formed on the planarization layer 35 to condense the light.

Although not shown, an optical shielding layer is provided in the insulating interlayer 32, to prevent the light from being incident on the remaining portions except the photodiode 31.

At this time, it is possible to provide a photogate instead of the photodiode.

Also, the curvature and height of the second micro-lens 37 are determined in due consideration of a focus of the incident light. In case of the present invention, the plurality of first micro-lens of the concave pattern are provided below the second micro-lens 37, so that the light-condensing efficiency improves, thereby increasing the designing margin.

A method for fabricating the CMOS image sensor according to the present invention will be described as follows.

First, as shown in FIG. 4A, the plurality of photosensitive devices, for example, the photodiodes 31 are formed on the semiconductor substrate, and then the insulating interlayer 32 is formed thereon. At this time, the insulating interlayer 32 may have a multi-layered structure. Although not shown, after forming a single-layered insulating interlayer, the optical shielding layer may be formed to prevent the light from being incident on the remaining portions except the photodiodes 31, and then the additional insulating interlayer may be formed thereon.

Subsequently, the protective layer 33 is formed flat on the insulating interlayer 32, to protect the device from moisture and scratch. Then, the R/G/B color filter layers 34 are formed on the protective layer 33, wherein the R/G/B color filter layers 34 filter the light by the respective wavelengths. After that, the planarization layer 36 is formed on the color filter layers 34, for obtaining planarization to control the focal distance and to form the micro-lens layers.

Referring to FIG. 4B, after patterning the mask layer to have the plurality of open areas in correspondence with the portions of the second micro-lens 37, the planarization layer 36 is etched with the patterned mask layer. As a result, the plurality of first micro lens (fly eye lens) 36 of the concave pattern are formed in intaglio, wherein each of the first micro lens has a diameter between 0.3 µm and 0.4 µm.

On the exposure process for forming the planarization layer, the open areas of the mask layer are densely provided around the center in each of the portions corresponding to the second micro-lens. Also, the open area of the mask layer has the size not to completely develop a planarization photoresist by an etchant.

The process of forming the first micro-lens 36 is simultaneously performed with the process of removing the planarization layer 36 except the portion of the cell of the color filter array CFA.

Subsequently, as shown in FIG. 4C, the second micro-lens 37 are provided in correspondence with the respective photodiodes 31 by coating the material layer for the micro-lens, and performing the patterning and reflowing process thereon.

In the CMOS image sensor and the method for fabricating the same according to the present invention, the plurality of concave micro-lens are densely provided below the center in each of the portions corresponding to the convex micro-lens, thereby improving the light-condensing efficiency.

Accordingly, the CMOS image sensor and the method for fabricating the same according to the present invention has the following advantages.

In the method for fabricating the CMOS image sensor according to the present invention, the lower micro lens of the fly eye lens type are provided below the main micro-lens so as to improve the characteristics of light of traveling straightly. As a result, it is possible to obtain the light-condensing efficiency greater than that of the single-layered lens.

By improving the light-condensing efficiency, it is possible to increase the amount of light passing through the color filter layers and being incident on the photodiodes, thereby improving the resolution. As a result, the efficiency of the CMOS image sensor improves.

In addition, on forming the micro-lens, it is possible to provide the micro-lens without limitation to the thickness, thereby obtaining the simplified fabrication process and the sufficient fabrication margin.

When patterning the planarization layer, the sub micro-lens are formed together, so that it is possible to improve the light-condensing efficiency without the additional fabrication process and the increase of fabrication cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A CMOS image sensor comprising:
   a plurality of photosensitive devices on a semiconductor substrate;
   an insulating interlayer on the plurality of photosensitive devices;
   a plurality of color filter layers in correspondence with the respective photosensitive devices, to filter the light by respective wavelengths;
   a planarization layer on the color filter layers, and having first micro-lens by intaglio in correspondence with respective photosensitive patterns to condense the light secondly; and
   a plurality of second micro-lens layers on the planarization layer in correspondence with the respective photosensitive devices, to condense the light firstly.

2. The CMOS image sensor of claim 1, wherein each of the second micro-lens layers is formed in a convex shape, and the plurality of first micro lens of the concave pattern are provided below each of the second micro-lens layers.

3. The CMOS image sensor of claim 2, wherein each concave pattern of the first micro-lens is filled with a material for the second micro-lens layer.

* * * * *